(12) United States Patent
Yamamoto et al.

(10) Patent No.: US 7,952,648 B2
(45) Date of Patent: May 31, 2011

(54) BROADCAST RECEPTION MODULE AND BROADCAST DEVICE USING THE SAME

(75) Inventors: Shinji Yamamoto, Osaka (JP); Yasunobu Tsukio, Osaka (JP)

(73) Assignee: Panasonic Corporation, Osaka (JP)

( * ) Notice: Subject to any disclaimer, the term of this patent is extended or adjusted under 35 U.S.C. 154(b) by 772 days.

(21) Appl. No.: 11/573,719

(22) PCT Filed: Jul. 10, 2006

(86) PCT No.: PCT/JP2006/313681
§ 371 (c)(1),
(2), (4) Date: Feb. 15, 2007

(87) PCT Pub. No.: WO2007/007712
PCT Pub. Date: Jan. 18, 2007

(65) Prior Publication Data
US 2008/0316369 A1 Dec. 25, 2008

(30) Foreign Application Priority Data

Jul. 11, 2005 (JP) ................. 2005-201503

(51) Int. Cl.
*H04N 5/50* (2006.01)
(52) U.S. Cl. ........................ 348/731; 348/732
(58) Field of Classification Search .......... 348/731, 348/570, 725, 180, 192; 455/67.11, 226.1–226.3; 375/326, 344
See application file for complete search history.

(56) References Cited

U.S. PATENT DOCUMENTS

| | | | | |
|---|---|---|---|---|
| 4,805,020 A | * | 2/1989 | Greenberg | 348/460 |
| 5,436,675 A | * | 7/1995 | Hayashi et al. | 725/72 |
| 5,479,214 A | * | 12/1995 | Sakakibara et al. | 348/558 |
| 6,091,458 A | * | 7/2000 | Jeon et al. | 348/554 |
| 6,577,353 B1 | * | 6/2003 | Welles et al. | 348/706 |
| 6,731,349 B1 | * | 5/2004 | Van Der Wijst | 348/732 |
| 6,741,293 B1 | * | 5/2004 | Obuchi | 348/554 |
| 7,061,542 B1 | * | 6/2006 | Ikeguchi | 348/558 |
| 7,080,393 B2 | * | 7/2006 | Morisada et al. | 725/38 |
| 2004/0063450 A1 | * | 4/2004 | Uhlik | 455/517 |
| 2004/0176061 A1 | * | 9/2004 | Zehnle et al. | 455/191.1 |
| 2006/0033846 A1 | * | 2/2006 | Ozaki et al. | 348/731 |

FOREIGN PATENT DOCUMENTS

| | | |
|---|---|---|
| JP | 59-126314 | 7/1984 |
| JP | 5-55623 | 7/1993 |
| JP | 5-85127 | 11/1993 |
| JP | 6-15343 | 2/1994 |
| JP | 2003-125309 | 4/2003 |
| JP | 2003-333441 | 11/2004 |
| JP | 2004-320528 | 11/2004 |
| JP | 2005-64585 | 3/2005 |
| JP | 2005-117226 | 4/2005 |

* cited by examiner

*Primary Examiner* — Victor Kostak
(74) *Attorney, Agent, or Firm* — Pearne & Gordon LLP

(57) ABSTRACT

A broadcast module includes a receiver for selecting the signal of a specific channel from the signals of a plurality of channels under control of a controller; a demodulator connected to the output of the receiver; a detector for detecting the signal-to-noise ratio of the signal selected by the receiver; and a comparator for comparing the signal-to-noise ratio detected by the detector with a predetermined level. The broadcast module can reduce the time required to specify a viewable channel.

13 Claims, 6 Drawing Sheets

BROADCAST RECEPTION MODULE AND BROADCAST DEVICE USING THE SAME

This application is a U.S. National Phase Application of PCT International Application PCT/JP2006/313681.

TECHNICAL FIELD

The present invention relates to a broadcast receiving module for receiving signals and also to broadcast equipment using the module.

BACKGROUND ART

Conventional broadcast equipment 101 is described as follows with reference to drawings.

FIG. 7 is a block diagram of conventional broadcast equipment 101, which includes antenna 102, broadcast receiving module 103, and display unit 104. Broadcast receiving module 103 includes receiver 105, demodulator 106 connected to the output of receiver 105, and signal processor 107 connected to the output of demodulator 106. Receiver 105 selects the signal of a certain channel from the signals of a plurality of channels received by antenna 102. Receiver 105, demodulator 106, and signal processor 107 are further connected to controller 108, which is also connected to input keys 111 and storage 112 including information of each channel.

Broadcast receiving module 103 of conventional type operates as follows.

In a case where the signal of the channel selected by receiver 105 is set to be the signal of a channel N (N is a natural number), when the user pushes a "next channel" button on input keys 111, controller 108 detects the signal coming from input keys 111. Controller 108 then reads from storage 112 the information of a first channel, which is a channel N+1 (or N−1) and sets the signal selected by receiver 105 to the signal of the first channel, based on the information of the first channel. Controller 108 then sets the channel of the signal to be demodulated by demodulator 106 to the first channel and determines whether the demodulated signal of the first channel demodulated by demodulator 106 contains a broadcast signal or not. The first channel is determined to be viewable or not in this manner.

When the demodulated signal of the first channel is determined to contain a broadcast signal, controller 108 controls signal processor 107 to process the demodulated signal of the first channel. On the other hand, when the demodulated signal of the first channel is determined not to contain a broadcast signal, controller 108 reads from storage 112 the information of a second channel, which is a channel N+2 (or N−2) and performs the same processes as those for the first channel. Thus, controller 108 repeats these processes until it determines that a certain demodulated signal contains a broadcast signal, that is, until a viewable channel is specified.

A related art of the present invention is Japanese Patent Unexamined Publication No. 2003-333441.

In a conventional broadcast receiving module like this, however, controller 108 determines whether the first channel is viewable or not based on whether the demodulated signal of the first channel contains a broadcast signal or not. Therefore, controller 108 can determine whether the first channel is viewable or not only after demodulator 106 completes the demodulation. This makes it time-consuming to specify a viewable channel.

SUMMARY OF THE INVENTION

The broadcast receiving module and the broadcast equipment using the module of the present invention have solved the aforementioned problem and reduced the time required to specify a viewable channel in channel scanning.

The broadcast receiving module of the present invention includes a controller; a receiver which can receive the signals of a plurality of channels and which selects the signal of a specific channel from the signals of the plurality of channels under control of the controller; a demodulator connected to the output of the receiver; a detector for detecting the signal-to-noise ratio of the signal selected by the receiver; and a comparator for comparing the signal-to-noise ratio detected by the detector with a predetermined level. In a case where the receiver has selected the signal of a first channel, when the comparison result of the comparator indicates that the signal-to-noise ratio of the signal of the first channel is below the predetermined level, the controller controls the receiver to replace the signal of the first channel with the signal of a second channel. On the other hand, when the comparison result of the comparator indicates that the signal-to-noise ratio of the signal of the first channel is not less than the predetermined level, the controller controls the demodulator to demodulate the signal of the first channel.

This structure enables the controller to determine whether the first channel is viewable or not based on the comparison result of the comparator without the need for the demodulator to demodulate the signal of the first channel. Thus, it becomes possible to reduce the time required to specify the viewable channel in channel scanning.

The broadcast receiving module of the present invention further includes a broadcast signal detector for determining whether the signal of the first channel demodulated by the demodulator contains a broadcast signal or not. When the broadcast signal detector determines that the signal of the first channel does not contain the broadcast signal, the controller controls the receiver to select the signal of the second channel.

This structure with the broadcast signal detector enables the controller to determine that the first channel is unviewable when the signal of the first channel has a signal-to-noise ratio not less than a predetermined level due to noise although the signal contains no broadcast signal. This ensures the specification of the viewable channel in channel scanning. In other words, only a signal having a signal-to-noise ratio not less than the predetermined level is demodulated to determine the presence or absence of the broadcast signal. Thus, it becomes possible to reduce the time required to specify the viewable channel in channel scanning.

The broadcast receiving module of the present invention further includes a storage for storing information of the first channel when the comparison result of the comparator indicates that the signal-to-noise ratio of the first channel is not less than the predetermined level.

In the structure with the storage, once the viewable first channel is specified, from the next time, the controller can select the first channel based on the information of the first channel stored in the storage without the need for channel scanning.

The broadcast receiving module of the present invention includes a first receiver and a second receiver each capable of receiving the signals of a plurality of channels and each selecting the signal of a specific channel from the signals of the plurality of channels under control of the controller; a demodulator connected to the output of the first receiver and the output of the second receiver; a detector for detecting the signal-to-noise ratio of the signal selected by the second receiver; and a comparator for comparing the signal-to-noise ratio detected by the detector with a predetermined level. In a case where the first receiver has selected the signal of a first channel, the controller controls the second receiver to select the signal of a second channel. When the comparison result of the comparator indicates that the signal-to-noise ratio of the signal of the second channel is not less than the predetermined level, the controller controls the storage to store information of the second channel.

With this structure, while the user is watching the first channel selected by the first receiver, the viewable channel can be specified using the second receiver and be stored in the storage. Therefore, once a viewable second channel is specified, from the next time, the controller can select the second channel based on the information of the second channel stored in the storage without the need for channel scanning.

In general, a digital broadcast signal has a plurality of combinations of broadcast mode and guard interval. Therefore, the modulation of the digital broadcast signal has to be performed a plurality of times. This means that it takes more time to demodulate a digital broadcast signal than an analog broadcast signal. As a result, detecting the signal-to-noise ratio of the digital broadcast signal before demodulation can greatly reduce the time required to specify the viewable channel during channel scanning.

Figure 1:
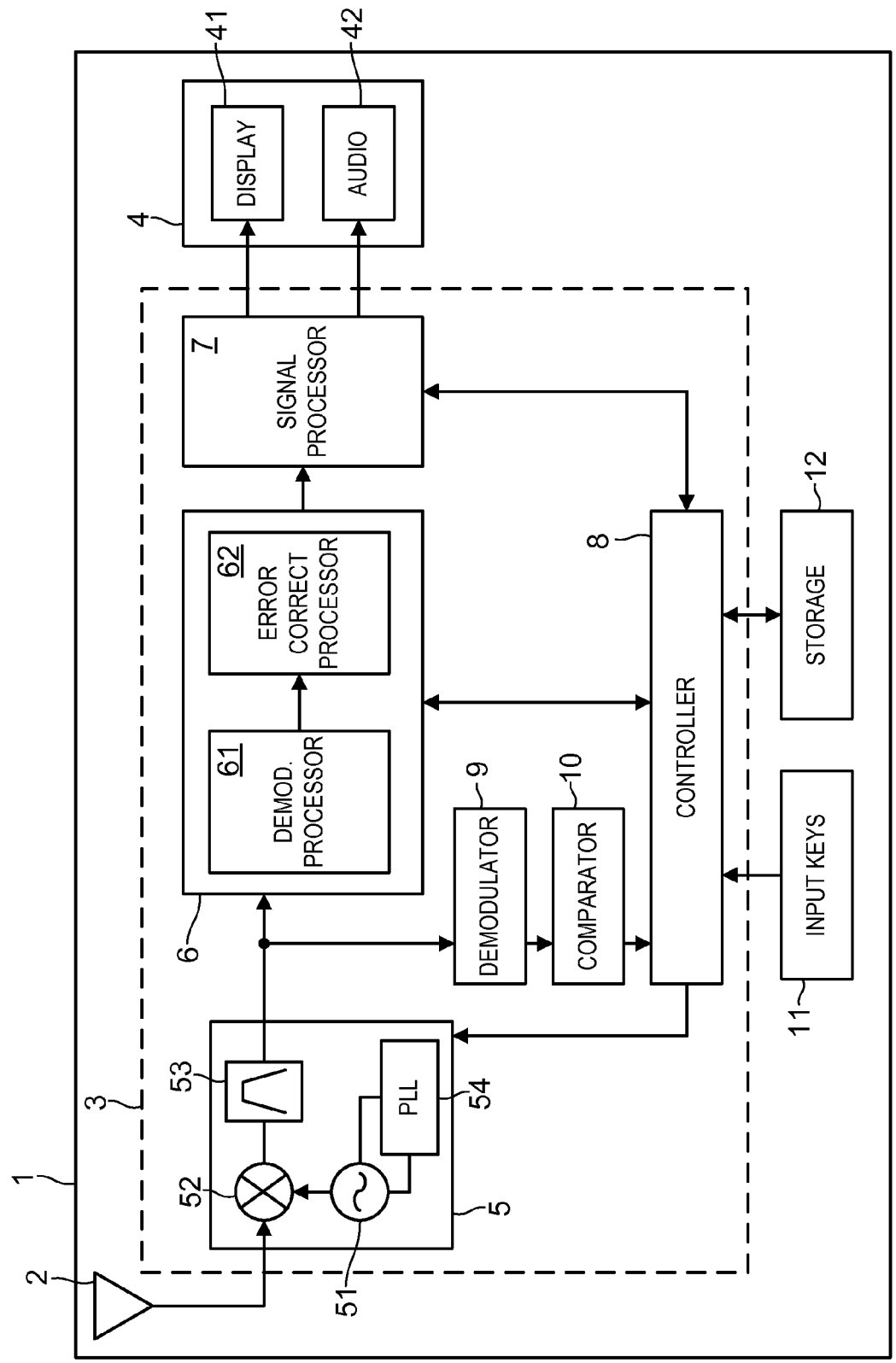
FIG. 1 is a block diagram of broadcast equipment of the first embodiment of the present invention.

REFERENCE MARKS IN THE DRAWINGS 1 broadcast equipment
2 antenna
3 broadcast receiving module
4 display unit
5 receiver
6 demodulator
7 signal processor
8 controller
9 detector
10 comparator
11 input keys
12 storage

DETAILED DESCRIPTION OF PREFERRED EMBODIMENTS

First Exemplary Embodiment

A broadcast receiving module and broadcast equipment using the module of a first embodiment are described as follows with reference to FIGS. 1 and 2.

FIG. 1 is a block diagram of the broadcast equipment of the first embodiment. In FIG. 1, broadcast equipment 1 can be, for example, a portable terminal with TV function or an in-car television. Broadcast equipment 1 includes antenna 2, broadcast receiving module 3, and display unit 4. Broadcast receiving module 3 includes receiver 5, demodulator 6 connected to the output of receiver 5, and signal processor 7 connected to the output of demodulator 6. Receiver 5, demodulator 6, and signal processor 7 are further connected to controller 8. The output of receiver 5 is connected to detector 9 whose output is connected to comparator 10 whose output is connected to controller 8. Controller 8 is further connected to input keys 11 and storage 12. In a case where broadcast equipment 1 is a portable phone or other portable device, a viewable channel is likely to change because the location to receive the broadcast signal changes.

The following is a detailed description of each component of broadcast equipment 1.

Antenna 2 receives the broadcast signals of a plurality of digital terrestrial broadcast channels and provides these signals to receiver 5.

Receiver 5, which can receive the signals of the plurality of channels from antenna 2, selects the signal of a specific channel from the signals. In other words, receiver 5 selects a specific channel from the plurality of channels. Receiver 5 includes local oscillator 51 for outputting a signal having a predetermined frequency and mixer 52 for mixing the signal from local oscillator 51 with the broadcast signal received from antenna 2. Receiver 5 further includes filter 53 for receiving an output of mixer 52 and PLL circuit 54 loop-connected to local oscillator 51. Receiver 5 selects the specific channel by receiving information of the specific channel such as channel frequency band from controller 8. More specifically, PLL circuit 54 determines the frequency of the signal supplied from local oscillator 51 to mixer 52 based on the information of the specific channel received from controller 8, and filter 53 determines the frequency band of the signal to be filtered. The signal of the specific channel received from receiver 5 is provided to demodulator 6 and detector 9.

Demodulator 6 includes demodulation processor 61 for demodulating the signal selected by receiver 5 and error-correction processor 62 connected to the output of demodulation processor 61. In one-segment broadcasting, which is a type of digital terrestrial broadcasting, there are two broadcast modes and four guard intervals. When demodulator 6 demodulates the one-segment signal of digital terrestrial broadcasting, the demodulation is performed in response to the combination of broadcast mode and guard interval. In accordance with the combinations of broadcast mode and guard interval, there are a plurality of pieces of demodulation setup data. Demodulator 6 receives these pieces of demodulation setup data from controller 8 and demodulates the signal of the specific channel received from receiver 5.

Signal processor 7 decodes the encoded signal of the specific channel demodulated by demodulator 6 to an audio signal and a visual signal, and provides these signals to display unit 4.

Display unit 4 includes movie display device 41 such as a liquid crystal display device for displaying the visual signal received from signal processor 7 and audio output device 42 for outputting the audio signal received from signal processor 7.

Controller 8 controls receiver 5, demodulator 6, signal processor 7, and other components. The operation of controller 8 will be described in detail later.

Detector 9 detects the signal-to-noise ratio of the signal of the specific channel selected by receiver 5. The signal-to-noise ratio is the magnitude of the amplitude of the signal selected by receiver 5, and can be, for example, an AGC voltage detected by an AGC circuit. Detector 9 may or may not be contained in the same IC as demodulator 6. It is preferable to provide a narrow-band filter (unillustrated) having higher transmission characteristics than filter 53 between detector 9 and receiver 5 in order to remove the noise contained in the signal selected by receiver 5.

Comparator 10 compares the signal-to-noise ratio of the signal detected by detector 9 with a predetermined level and then outputs a signal indicating which of the two values is larger to controller 8. The predetermined level mentioned here is the level of the signal-to-noise ratio. Comparator 10 may or may not be contained in the same IC as controller 8.

Input keys 11 include, for example, an on-off key which allows the user to power on or power off, an up-channel key which allows the user to move to the next upper channel from the received channel, and a down-channel key which allows the user to move to the next lower channel from the received channel. Input keys 11 may include a channel scan key which allows the user to make broadcast equipment 1 start channel scanning.

Storage 12 includes the aforementioned demodulation setup data and channel information.

The operation of the channel scanning by controller 8 of broadcast equipment 1 is described as follows with reference to FIG. 2.

Figure 2:
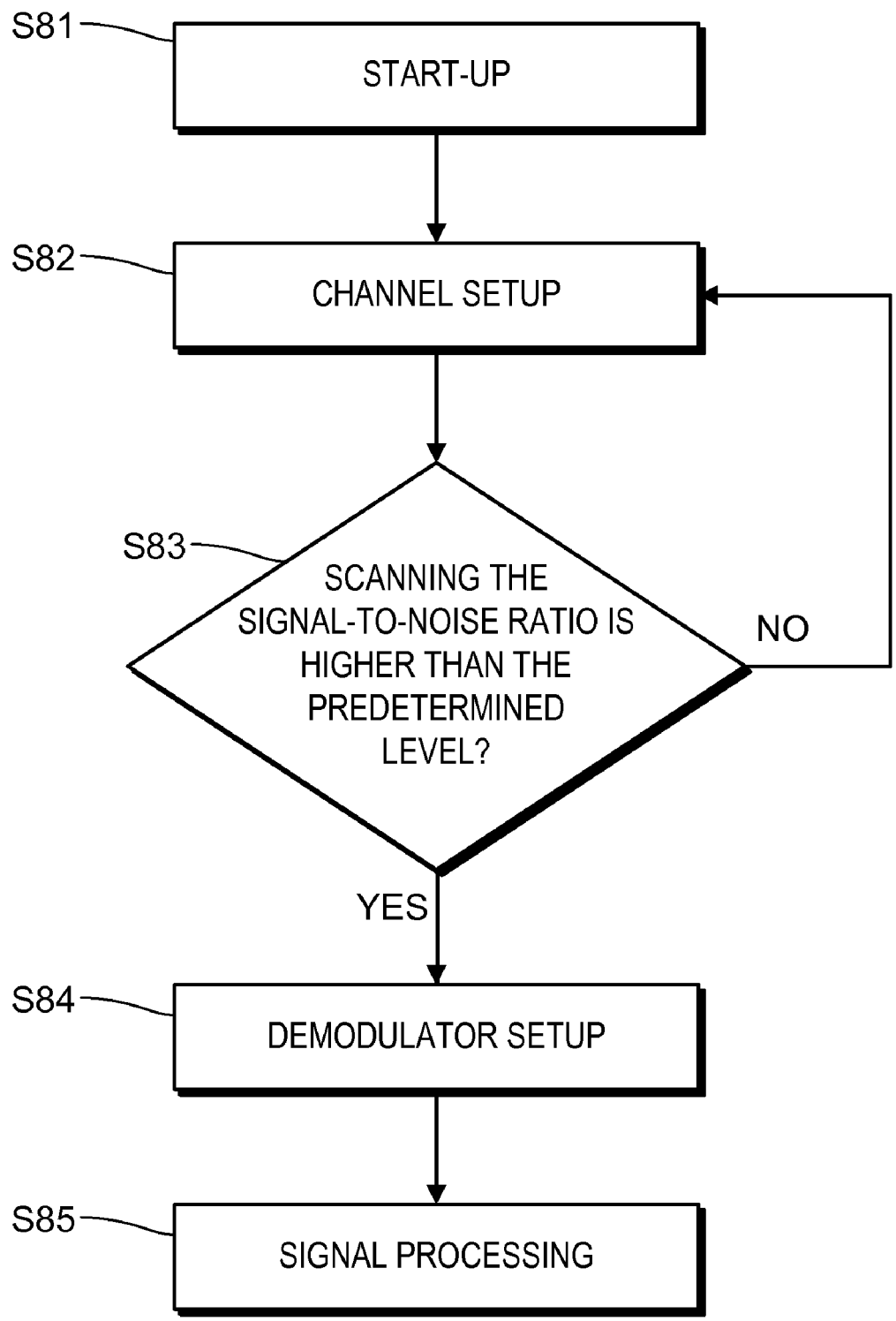
FIG. 2 is a flowchart showing operation of the broadcast equipment of the first embodiment of the present invention.

FIG. 2 is a flowchart showing the operation of the broadcast equipment of the first embodiment of the present invention. Display unit 4 shown in FIG. 1 may initially be in a state of displaying a broadcast program of a certain channel, in a state of displaying no broadcast program, or in a state of power-off.

First of all, at start-up step S81, controller 8 starts channel scanning by detecting an input from the on-off key, the up-channel key, the down-channel key, or the channel scan key. In start-up step S81, controller 8 may check with storage 12 whether there is a next viewable channel or not. When the next viewable channel is present, controller 8 can control the receiver to select the viewable channel without performing the following channel scanning.

At channel setup step S82, controller 8 performs channel setup. More specifically, controller 8 reads the information of the first channel from storage 12 and provides the information to PLL circuit 54 and filter 53 of receiver 5. Receiver 5 selects the signal of the first channel from the signals of the plurality of channels and outputs the selected signal to demodulator 6 and detector 9. Detector 9 receives the signal of the first channel from receiver 5 and detects the signal-to-noise ratio, and comparator 10 compares the signal-to-noise ratio with the predetermined level.

At scanning step S83, controller 8 receives the signal of the first channel from comparator 10 and determines whether or not the signal-to-noise ratio of the signal is not less than the predetermined level. When controller 8 determines that the signal-to-noise ratio of the signal of the first channel is below the predetermined level, the first channel is determined not to be viewable. Then, the procedure returns to channel setup step S82 in which controller 8 reads the information of the second channel from storage 12 and provides it to receiver 5. After this, the same processes as for the signal of the first channel are performed for the signal of the second channel. The second channel is the channel next to the first channel, that is, the channel having a higher or lower frequency band than the first channel.

On the other hand, when controller 8 determines that the signal-to-noise ratio of the signal of the first channel is not less than the predetermined level at scanning step S83, the procedure goes to demodulator setup step S84. At demodulator setup step S84, controller 8 sets up demodulator 6 to demodulate the signal of the first channel received from receiver 5. More specifically, controller 8 provides demodulator 6 with the demodulation setup data. In demodulator setup step S84, controller 8 monitors the time elapsed from the beginning of this step. When the elapsed time reaches a prescribed time, controller 8 provides demodulator 6 with the next demodulation setup data.

The procedure then goes to signal processing step S85, in which controller 8 controls signal processor 7 to process the demodulated signal received from demodulator 6.

Thus, controller 8 repeats channel setup step S82 and scanning step S83 until it specifies a viewable channel. This structure enables controller 8 to determine whether the first channel is viewable or not based on the comparison result of comparator 10 without the need for demodulator 6 to demodulate the signal of the first channel. Thus, it becomes possible to reduce the time required to specify the viewable channel in channel scanning.

It is preferable that controller 8 should store the information of the first channel to storage 12 when it determines at scanning step S83 that the signal-to-noise ratio of the signal of the first channel is not less than the predetermined level. By doing so, once the viewable first channel is specified, from the next time, controller 8 can select the first channel based on the information of the first channel stored in storage 12 without the need for channel scanning.

An analog broadcast signal has a greater signal strength than a digital broadcast signal. Therefore, the signal-to-noise ratio detected by detector 9 is larger in analog broadcasting than in digital broadcasting. This enables, in digital broadcasting, controller 8 to determine whether the signal of the first channel is a digital broadcast signal or an analog broadcast signal based on the signal-to-noise ratio detected by detector 9 in the channel scanning at scanning step S83. In this case, the signal-to-noise ratio of a digital broadcast signal received near a broadcast station is the maximum value to determine that the broadcasting is digital broadcasting. This prevents an analog broadcasting channel with a strong electric field from being specified as a viewable channel in the case of the channel scanning for digital broadcasting. In this case, however, controller 8 incorrectly could determine, for example, an analog broadcasting channel with a weak electric field to be a digital broadcasting channel. To avoid this, an analog broadcasting demodulator (unillustrated) may be added in parallel with demodulator 6 and be provided with the signal from receiver 5. As a result, controller 8 can determine whether the demodulated signal contains an analog broadcast signal or not. The time required to demodulate an analog broadcast signal is shorter than the time required to demodulate a digital broadcast signal. Therefore, it is easily found whether the broadcast signal selected by receiver 5 is a digital broadcast signal or an analog broadcast signal.

Note that demodulator 6 may be designed to demodulate not a one-segment broadcast signal but a three- or 12-segment broadcast signal or an analog broadcast signal. In any of these cases, the time to specify a viewable channel in channel scanning can be reduced in the same manner as described above.

The broadcast equipment of the present invention can reduce the time of the channel scanning in the case of a broadcast capable of detecting a signal-to-noise ratio such as digital radio or a satellite digital broadcast.

Second Exemplary Embodiment

A broadcast receiving module and broadcast equipment using the module of a second embodiment are described as follows with reference to FIGS. 3 and 4. Each component in the present embodiment is identical to its counterpart in the first embodiment unless otherwise noted.

Figure 3:
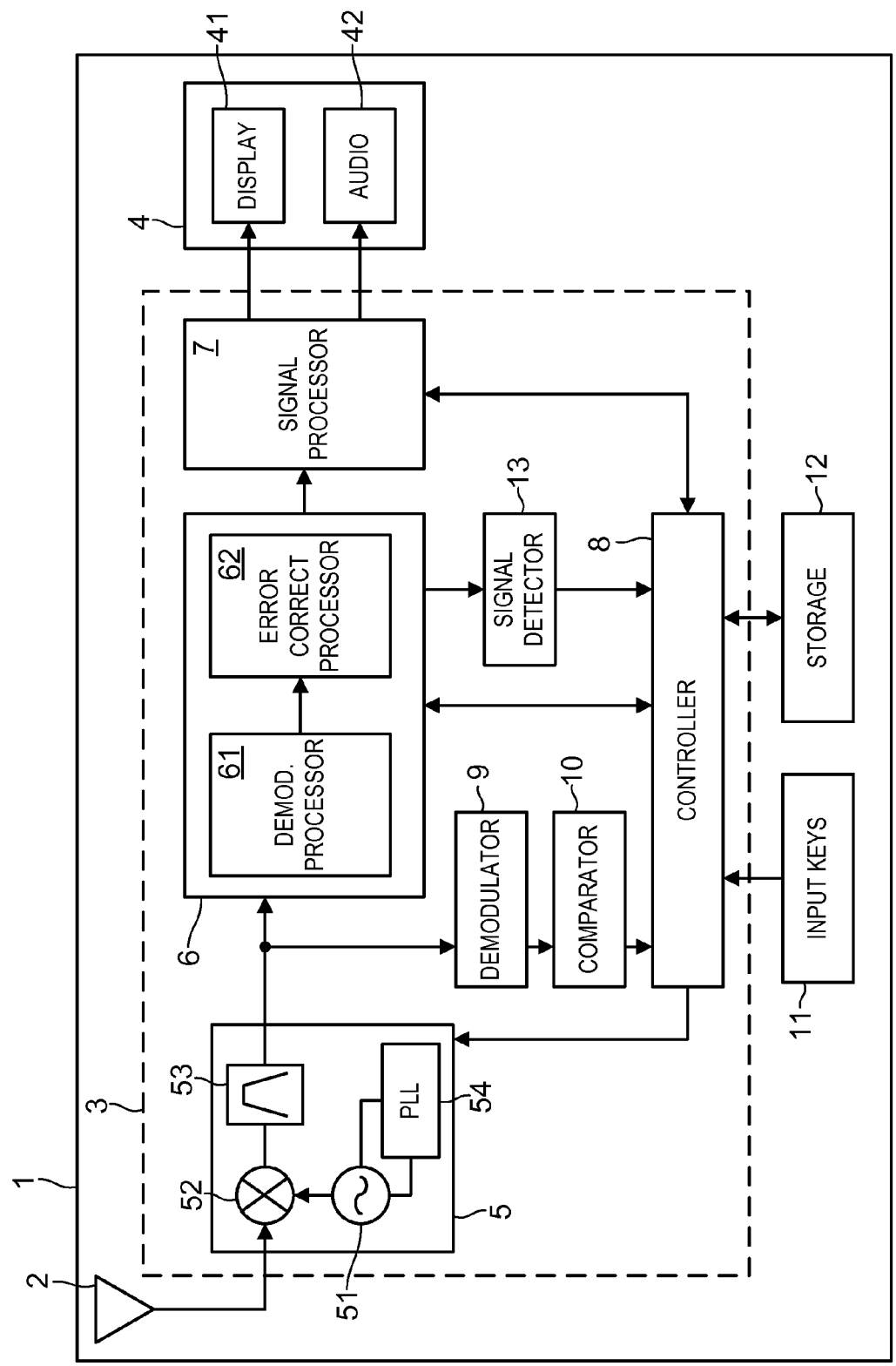
FIG. 3 is a block diagram of broadcast equipment of a second embodiment of the present invention.

FIG. 3 is a block diagram of the broadcast receiving module and the broadcast equipment using the module of the second embodiment. In FIG. 3, broadcast receiving module 3 includes broadcast signal detector 13 provided between demodulator 6 and controller 8. Broadcast signal detector 13 determines whether the signal of the first channel demodulated by demodulator 6 contains a broadcast signal or not and informs the determination result to the controller. This broadcast signal can be, for example, TMCC (Transmission and Multiplexing Configuration Control) information as the header of the signal of the first channel.

The operation of the channel scanning by controller 8 of broadcast equipment 1 is described as follows with reference to FIG. 4.

Figure 4:
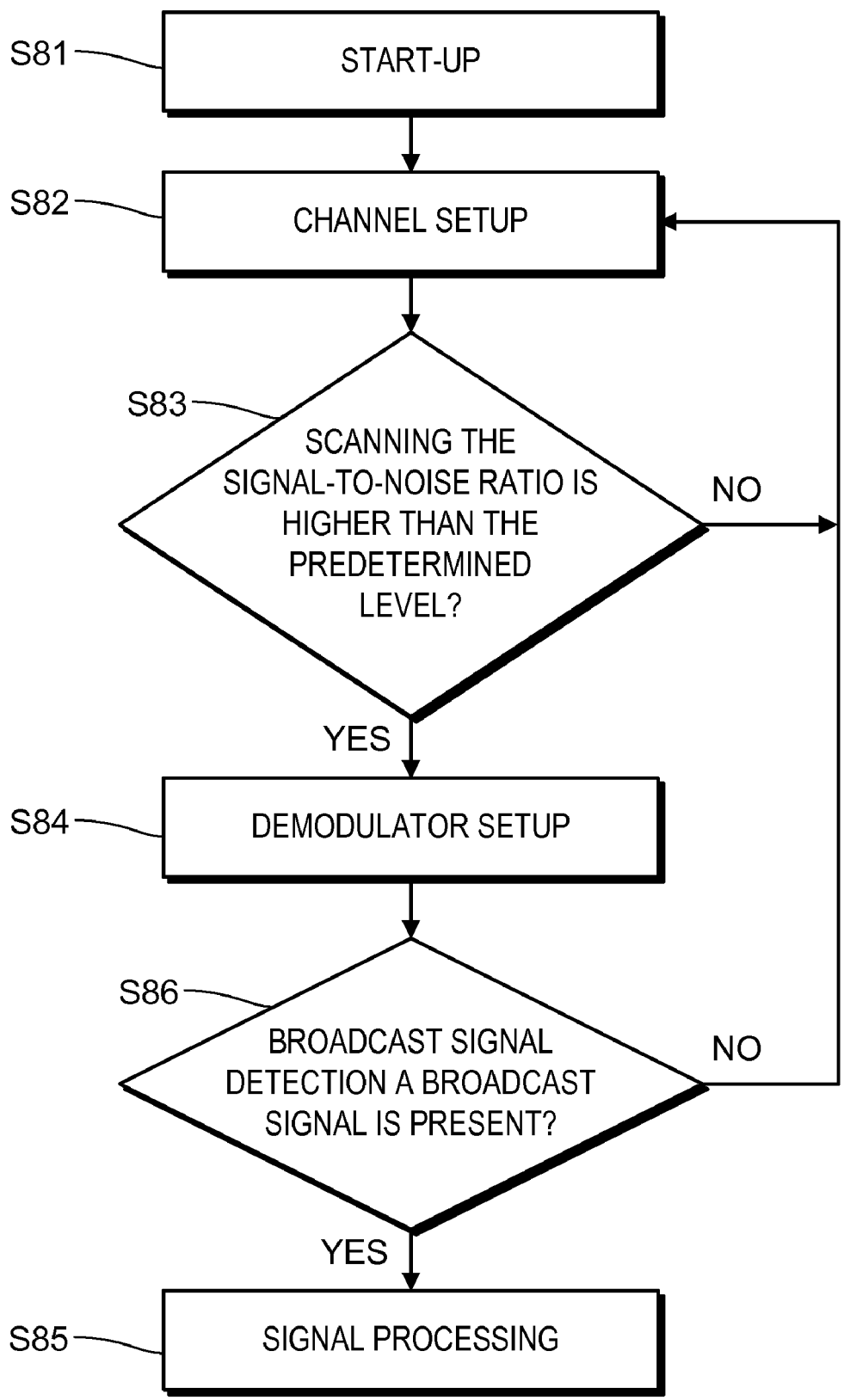
FIG. 4 is a flowchart showing operation of the broadcast equipment of the second embodiment of the present invention.

FIG. 4 is a flowchart showing the operation of the broadcast equipment of the second embodiment of the present invention. The flowchart of FIG. 4 differs from that of FIG. 2 in that broadcast signal detecting step S86 is added after demodulator setup step S84.

At broadcast signal detecting step S86, controller 8 determines that the first channel is not viewable when the signal of the first channel is determined not to contain a broadcast signal based on the determination of broadcast signal detector 13 (S86). In other words, controller 8 determines that the first channel is not viewable when the signal of the first channel does not contain a broadcast signal even if the signal of the first channel has a signal-to-noise ratio not less than the predetermined level. Then, the procedure returns to channel setup step S82, in which controller 8 provides the receiver with information of the second channel. Controller 8 then performs the same processes for the signal of the second channel as for the signal of the first channel.

On the other hand, when the signal of the first channel contains a broadcast signal, controller 8 determines that the first channel is viewable, and the procedure goes to signal processing step S85.

Thus, controller 8 repeats from channel setup step S82 to broadcast signal detecting step S86 until it specifies a viewable channel. This structure enables controller 8 to determine that the first channel is unviewable when the signal of the first channel has a signal-to-noise ratio not less than the predetermined level due to noise although the first channel contains no broadcast signal. This ensures the specification of the viewable channel in channel scanning. In other words, only a signal having a signal-to-noise ratio not less than the predetermined level is demodulated to determine the presence or absence of the broadcast signal. Thus, it becomes possible to reduce the time required to specify the viewable channel in channel scanning.

In broadcast signal detecting step S86, controller 8 monitors the time elapsed from the beginning of this step. When the elapsed time reaches a prescribed time without broadcast signal detector 13 detecting the broadcast signal, the demodulation setup data is changed to the demodulation setup data in accordance with the next combination of broadcast mode and guard interval. After the signal of the first channel is demodulated by the setup, it is determined again whether the demodulated signal contains a broadcast signal or not. When the signal of the first channel does not contain a broadcast signal in all the demodulation setup data, controller 8 determines that the first channel is unviewable, and the procedure returns to channel setup step S82. Note that when determining that a signal demodulated with some demodulation setup data contains a broadcast signal, controller 8 may store the information of the demodulation setup data to storage 12. Thus, it becomes possible to reduce the time required to specify the viewable channel.

It is more preferable to provide a plurality of demodulators 6 to single receiver 5. Since the demodulation by demodulator 6 is slower than the detection by detector 9, the viewable channel can be specified quicker by demodulation with a plurality of parallel demodulators 6.

Third Exemplary Embodiment

A broadcast receiving module and broadcast equipment using the module of the present embodiment are described as follows with reference to FIGS. 5 and 6. Each component in the present embodiment is identical to its counterpart in the first embodiment unless otherwise noted.

Figure 5:
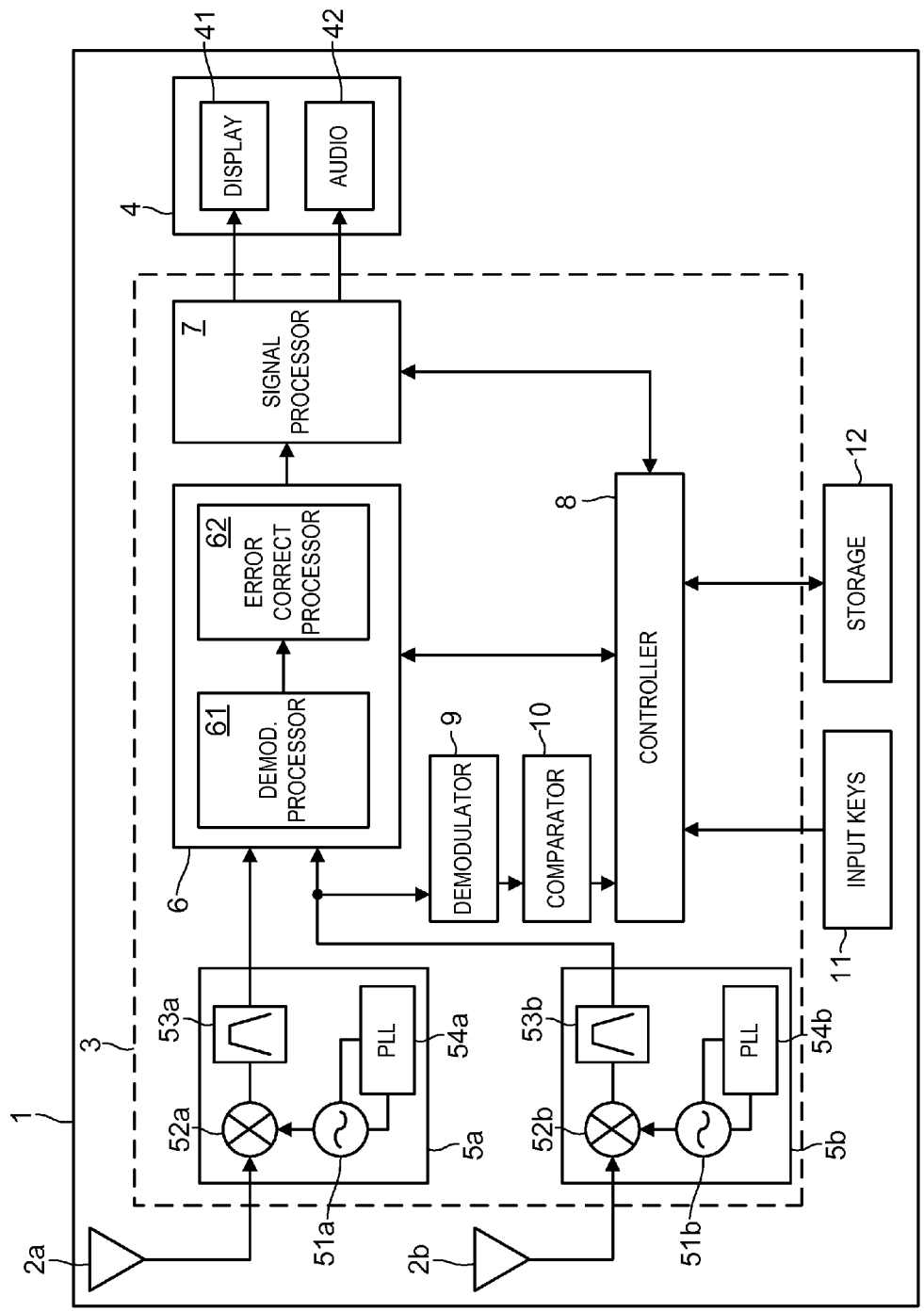
FIG. 5 is a block diagram of broadcast equipment of a third embodiment of the present invention.

FIG. 5 is a block diagram of broadcast equipment of the third embodiment of the present invention. In FIG. 5, broadcast equipment 1 includes two receivers: first receiver 5a and second receiver 5b. The outputs of first and second receivers 5a and 5b are connected to demodulator 6. The output of second receiver 5b is further connected to detector 9, comparator 10, and controller 8 in that order as in the first embodiment.

First receiver 5a includes first local oscillator 51a for outputting a signal having a predetermined frequency and first mixer 52a for mixing the signal from first local oscillator 51a with the broadcast signal from first antenna 2a. First receiver 5a further includes first filter 53a for receiving an output of first mixer 52a and first PLL circuit 54a loop-connected to first local oscillator 51a.

Second receiver 5b includes second local oscillator 51b for outputting a signal having a predetermined frequency, and second mixer 52b for mixing the signal from second local oscillator 51b with the broadcast signal from second antenna 2b. Second receiver 5b further includes second filter 53b for receiving an output of second mixer 52b and second PLL circuit 54b loop-connected to second local oscillator 51b.

Controller 8 controls first and second receivers 5a and 5b, demodulator 6, signal processor 7, and other components. Controller 8 receives an error rate value from error-correction processor 62 and usually controls demodulator 6 to demodulate only a signal received from first receiver 5a. However, when the error rate value of the signal from first receiver 5a is not less than a predetermined value, controller 8 determines that the signal from first receiver 5a has a poor reception quality. Then, controller 8 outputs a signal telling demodulator 6 to diversity-demodulate the signal from first receiver 5a and the signal from second receiver 5.

More specifically, when the reception quality of the signal from first receiver 5a degrades, controller 8 outputs the information of the same channel to both first and second receivers 5a and 5b so as to make these receivers receive the same information. Controller 8 further transmits the channel information to demodulator 6 and controls demodulator 6 to compose and demodulate the signal from first receiver 5a and the signal from receiver 5b. Demodulator 6 thus composes the signal from first receiver 5a and the signal from second receiver 5b, so that even if the reception quality of the signal from first receiver 5a degrades, the composed signal can be received with high reception sensitivity. Note that when determining that the signal from first receiver 5a has high reception quality, controller 8 controls first receiver 5a to operate exclusively, with second receiver 5b turned off. This results in a reduction in the power consumption of broadcast equipment 1.

The operation of the channel scanning by controller 8 of broadcast equipment 1 is described as follows with reference to FIG. 6.

Figure 6:
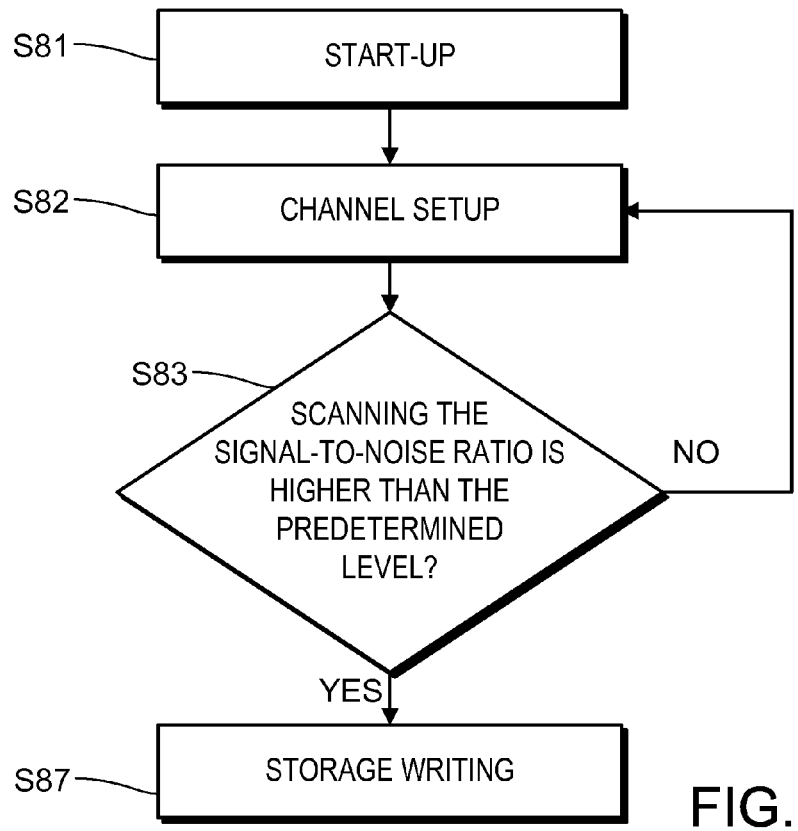
FIG. 6 is a flowchart showing operation of the broadcast equipment of the third embodiment of the present invention.
Figure 7:
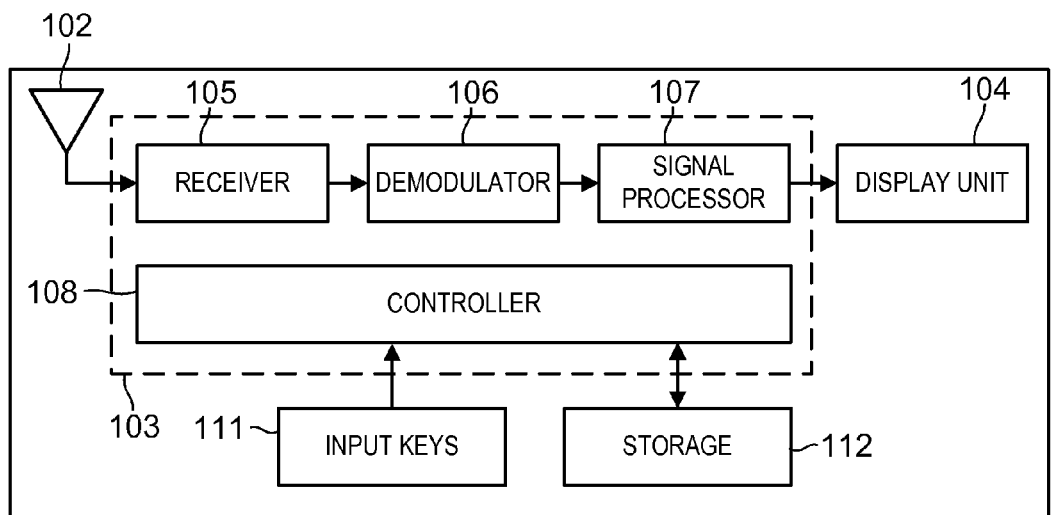
FIG. 7 is a block diagram of conventional broadcast equipment.

FIG. 6 is a flowchart showing the operation of the broadcast equipment of the third embodiment of the present invention. Demodulator 6 may initially be in a state of exclusively demodulating the signal of the first channel.

First of all, at start-up step S81, controller 8 starts channel scanning, for example, on an automatic and regular basis.

At channel setup step S82, controller 8 performs channel setup. More specifically, controller 8 reads the information of the second channel different from the first channel out of storage 12 and provides it to second receiver 5b. Second receiver 5b selects the signal of the second channel from the signals of the plurality of channels, and outputs it to demodulator 6 and detector 9. Detector 9 detects the signal-to-noise ratio of the signal of the second channel received from second receiver 5b. Comparator 10 compares the signal-to-noise ratio with the predetermined level.

At scanning step S83, controller 8 receives the signal from comparator 10 and determines whether or not the signal-to-noise ratio of the signal of the second channel is not less than the predetermined level. When the signal-to-noise ratio of the signal of the second channel is determined to be below the predetermined level, controller 8 determines that the second channel is unviewable. Then, the procedure returns to channel setup step S82 in which controller 8 reads the information of a third channel from storage 12 and provides it to second receiver 5b. After this, the same processes as for the signal of the first or second channel are repeated for the signal of the third channel. The third channel is the channel next to the second channel, that is, the channel having a higher or lower frequency band than the second channel.

On the other hand, when the signal-to-noise ratio of the signal of the second channel is determined to be not less than the predetermined level at scanning step S83, controller 8 determines that the second channel is viewable. Then, the procedure goes to storage writing step S87 in which controller 8 stores the information of the second channel to storage 12.

When storage writing step S87 is over, controller 8 terminates the channel scanning.

Thus, controller 8 repeats channel setup step S82 and scanning step S83 until it specifies a viewable channel. With this structure, while the user is watching the first channel selected by first receiver 5a, the viewable channel can be specified using second receiver 5b and be stored in storage 12. Once a viewable second channel is specified, from the next time, controller 8 can select the second channel based on the information of the second channel stored in storage 12 without the need for channel scanning.

When storage writing step S87 is over, the procedure may return to channel setup step S82 in which controller 8 can perform the same processes for the signal of the third channel as for the signal of the first or second channel. In other words, after specifying a certain viewable channel, controller 8 may perform channel scanning again to specify another viewable channel. By doing so, a larger number of viewable channels can be specified while the user is watching the first channel.

When the error rate value of the signal of the first channel which is supplied from first receiver 5a via error-correction processor 62 is not less than the predetermined value, controller 8 may suspend the channel scanning and output a signal telling demodulator 6 to diversity-demodulate the signal of the first channel from first receiver 5a and the signal of the first channel from second receiver 5. As a result, even if the reception quality of the signal from first receiver 5a degrades in the channel scanning, the high reception sensitivity of the composed signal can be maintained so as to maintain the quality of the image displayed on display unit 4. Furthermore, it is preferable that controller 8 should store the channel being scanned to storage 12 while the channel scanning is suspended. As a result, when the channel scanning is started next time, controller 8 can restart the scanning from the channel being scanned when the last channel scanning is suspended, thereby avoiding redundant processes.

The output of second receiver 5b may be connected not only to demodulator 6 but also to demodulator (unillustrated) provided for the second receiver. In this structure, while demodulator 6 is demodulating the signal of the first channel received from first receiver 5a, the demodulator for the second receiver demodulates the signal selected by second receiver 5b. Then, controller 8 determines whether the signal selected by second receiver 5b contains a broadcast signal or not. This enables controller 8 to determine the second channel to be unviewable when the signal of the second channel received from second receiver 5b has a signal-to-noise ratio not less than the predetermined level due to noise although the second channel contains no broadcast signal.

INDUSTRIAL APPLICABILITY

The broadcast receiving module and the broadcast equipment using the module of the present invention can reduce the time required to specify a viewable channel in channel scanning, thereby being applicable to in-car televisions and portable terminals.

The invention claimed is:

1. A broadcast receiving module comprising:
   a controller;
   a receiver for selecting a signal of a specific channel from signals of a plurality of channels from a common broadcast under control of the controller;
   a demodulator connected to an output of the receiver;
   a detector for detecting a signal-to-noise ratio of the signal selected by the receiver; and
   a comparator for comparing the signal-to-noise ratio detected by the detector with a predetermined level, wherein
   in a case where the receiver has selected a signal of a first channel, when a comparison result of the comparator indicates that the signal-to-noise ratio of the signal of the first channel is below the predetermined level, the controller controls the receiver to replace the signal of the first channel with a signal of a second channel from the common broadcast, and
   when the comparison result of the comparator indicates that the signal-to-noise ratio of the signal of the first channel is not less than the predetermined level, the controller controls the demodulator to demodulate the signal of the first channel.

2. The broadcast receiving module of claim 1 further comprising a broadcast signal detector for determining whether the signal of the first channel demodulated by the demodulator contains a broadcast signal or not, wherein
   when the broadcast signal detector determines that the signal of the first channel does not contain the broadcast signal, the controller controls the receiver to select the signal of the second channel.

3. The broadcast receiving module of claim 1 further comprising a storage, wherein
   the storage stores information of the first channel when the comparison result of the comparator indicates that the signal-to-noise ratio of the first channel is not less than the predetermined level.

4. The broadcast receiving module of claim 3, wherein
   the controller checks with the storage whether the first channel is viewable or not before controlling the receiver to select the first channel.

5. A broadcast receiving module comprising:

a controller;

a first receiver and a second receiver each for selecting a signal of a specific channel from signals of a plurality of channels under control of the controller;

a demodulator connected to an output of the first receiver and an output of the second receiver;

a detector for detecting a signal-to-noise ratio of the signal selected by the second receiver; and a comparator for comparing the signal-to-noise ratio detected by the detector with a predetermined level, wherein in a case where the first receiver has selected a signal of a first channel, the controller controls the second receiver to select a signal of a second channel, and when a comparison result of the comparator indicates that the signal-to-noise ratio of the signal of the second channel is not less than the predetermined level, the controller controls the storage to store information of the second channel.

6. The broadcast receiving module of claim 5, wherein when the comparison result of the comparator indicates that the signal-to-noise ratio of the signal of the second channel is below the predetermined level, the controller controls the second receiver to replace the signal of the second channel with a signal of a third channel.

7. The broadcast receiving module of claim 5, wherein when an error rate of the signal of the first channel received from the first receiver is determined to be not less than a predetermined value, the controller controls the second receiver to select the signal of the first channel, and also controls the demodulator to diversity-demodulate the signal of the first channel received from the first receiver and the signal of the first channel received from the second receiver.

8. The broadcast receiving module of claim 1, wherein the signal detected by the detector is a digital broadcast signal.

9. The broadcast receiving module of claim 1, wherein the controller determines whether the signal detected by the detector is a digital broadcast signal or an analog broadcast signal based on the signal-to-noise ratio detected by the detector.

10. The broadcast receiving module of claim 5, wherein the controller checks with the storage about information of the specific channel before controlling the first receiver to select the specific channel, and when the information of the specific channel is present, the controller controls the first receiver to select the signal of the specific channel.

11. Broadcast equipment comprising:

an antenna;

a controller;

a receiver for selecting a signal of a specific channel from signals of a plurality of channels from a common broadcast received by the antenna under control of the controller;

a demodulator connected to an output of the receiver;

a display unit connected to an output of the demodulator;

a detector for detecting a signal-to-noise ratio of the signal selected by the receiver; and a comparator for comparing the signal-to-noise ratio detected by the detector with a predetermined level, wherein in a case where the receiver has selected a signal of a first channel, when a comparison result of the comparator indicates that the signal-to-noise ratio is below the predetermined level, the controller controls the receiver to replace the signal of the first channel received by the antenna with a signal of a second channel from the common broadcast received by the antenna, and when the comparison result of the comparator indicates that the signal-to-noise ratio of the signal of the first channel is not less than the predetermined level, the controller controls the demodulator to demodulate the signal of the first channel.

12. Broadcast equipment comprising:

an antenna;

a controller;

a first receiver and a second receiver each for selecting a signal of a specific channel from signals of a plurality of channels from the antenna under control of the controller;

a demodulator connected to an output of the first receiver and an output of the second receiver;

a display unit connected to an output of the demodulator;

a detector for detecting a signal-to-noise ratio of the signal selected by the second receiver; and a comparator for comparing the signal-to-noise ratio detected by the detector with a predetermined level, wherein in a case where the first receiver has selected a signal of a first channel, the controller controls the second receiver to select a signal of a second channel, and when a comparison result of the comparator indicates that the signal-to-noise ratio of the signal of the second channel is not less than the predetermined level, the controller controls the storage to store information of the second channel.

13. The broadcast receiving module of claim 6, wherein when an error rate of the signal of the first channel received from the first receiver is determined to be not less than a predetermined value, the controller controls the second receiver to select the signal of the first channel, and also controls the demodulator to diversity-demodulate the signal of the first channel received from the first receiver and the signal of the first channel received from the second receiver.

\* \* \* \* \*